United States Patent
Kobayashi et al.

[11] Patent Number: 6,153,967
[45] Date of Patent: Nov. 28, 2000

[54] ULTRASONIC PROBE AND ULTRASONIC DIAGNOSTIC APPARATUS

[75] Inventors: Tsuyoshi Kobayashi; Shiroh Saitoh; Yohachi Yamashita; Senji Shimanuki, all of Kanagawa-ken; Kouichi Harada, Tokyo, all of Japan

[73] Assignee: Kabushiki Kaisha Toshiba, Kawasaki, Japan

[21] Appl. No.: 09/161,415

[22] Filed: Sep. 24, 1998

[30] Foreign Application Priority Data

Sep. 24, 1997 [JP] Japan ................. PO9-258095

[51] Int. Cl.⁷ ........................................ H01L 41/08
[52] U.S. Cl. .................. 310/334; 310/327; 310/335; 310/364
[58] Field of Search .................. 310/334–336, 310/364, 327

[56] References Cited

U.S. PATENT DOCUMENTS

| | | | |
|---|---|---|---|
| 3,973,152 | 8/1976 | Karplus | 310/327 |
| 4,259,607 | 3/1981 | Noguchi et al. | 310/364 |
| 4,434,384 | 2/1984 | Dunnrowicz et al. | 310/327 X |
| 4,505,160 | 3/1985 | Zacharias, Jr. | 310/327 X |
| 5,406,682 | 4/1995 | Zimnicki et al. | 310/364 X |
| 5,818,151 | 10/1998 | Takai et al. | 310/364 |

FOREIGN PATENT DOCUMENTS 3638342  5/1988  Germany ............... 310/364

*Primary Examiner*—Mark O. Budd
*Attorney, Agent, or Firm*—Oblon, Spivak, McClelland, Maier & Neustadt, P.C.

[57] ABSTRACT

An ultrasonic probe has strip-formed oscillators formed of a piezoelectric crystal material arranged in an array form. Metal layers are formed by a first layer of at least one of Ti, Ni and Cr, a second layer of at least one of Cu and Ni, and a third layer of at least one of Cu, Au, Pt, Ag and Pd. A backing material is fixed to the oscillators through the metal layers. With this structure, it is possible to manufacture an ultrasonic probe having a high sensitivity while maintaining a favorable dicing process, even while using a backing material having a low acoustic impedance and soft properties.

24 Claims, 9 Drawing Sheets

ULTRASONIC PROBE AND ULTRASONIC DIAGNOSTIC APPARATUS

BACKGROUND OF THE INVENTION

1. Field of the invention

This invention relates generally to an ultrasonic probe using a piezoelectric crystal material in an ultrasonic diagnostic apparatus and more particularly to an ultrasonic probe having metal layers between the piezoelectric crystal and the backing.

2. Discussion of the Background

Ultrasonic imaging apparatuses using an ultrasonic probe are involved with medical diagnostic apparatuses used to inspect body interiors, defect detecting apparatuses used to examine defects within metallic structures, and so on. In medical diagnostic apparatus, a color flow mapping (CFM) method has been developed that is adapted to display blood-flow speeds as two-dimensional color images by using ultrasonic Doppler shift due to blood flow, in addition to images of human bodies (B mode images). The center frequency of an ultrasonic probe is designed to be different depending upon an object to be diagnosed. Meanwhile, the center frequency for obtaining B mode images differs from the frequency of Doppler modes (Doppler reference frequency) for obtaining CFM images in that, for example, the former is at 3.75 MHz and the latter at 2.5 MHz.

The Doppler reference frequency is set lower than the center frequency in order to reduce the effect of attenuation in a human body. That is, the Doppler mode utilizes reflection echoes due to microscopic blood cells, and accordingly the available signal level is low.

Consequently, the ultrasonic probe should have a high signal level at a Doppler reference frequency, in addition to a B-mode frequency. In other words, there is a demand toward enhancing probe sensitivity over a wide range of frequencies.

In order to enhance the ultrasonic probe sensitivity, a low acoustic impedance material may be employed as a backing material, to reduce residual vibration, at a backside of an ultrasonic transmitting/receiving device.

For the ultrasonic probes in general production utilizing ceramics, the enhancement in sensitivity can be certainly achieved at frequencies around the center frequency of a probe by the above method. On the other hand, however, there is a reduction in sensitivity at frequencies distant from the center frequency, resulting in a narrowed bandwidth.

Another major problem lies in that there is degradation in workability in the dicing process where a low acoustic impedance material is employed as a backing material.

The present ultrasonic probe, having many strip-formed oscillators arranged in an array form, is manufactured by first adhering a large-sized oscillator plate to a backing material and then evenly cutting or dicing the oscillator at a fine pitch by using a dicing saw or the like, thus providing a group of oscillators arranged in an array. The pitch of dicing is as fine as several 10 $\mu$m to several hundreds $\mu$m. With such a pitch, the degraded cuttability to the oscillator results in a factor of reducing the probe manufacture yield. There is a tendency for the low acoustic impedance material as stated above to be softer than a material with high acoustic impedance. Due to this, certain disadvantages are encountered during dicing.

First, if a backing material is soft, the oscillator is not firmly fixed during dicing. During cutting, the oscillator is unstable and chatters due to the stress applied by the cutting blade. Further, the dicing saw blade tends to be loaded with the soft backing material, resulting in deterioration in cuttability. These factors, in turn, cause small chipping or cracking on each strip-formed oscillator, leading to disconnection of electrode layers of the oscillator, sensitivity reduction, etc. As a result, probe manufacture yield is not satisfactory.

SUMMARY OF THE INVENTION

Therefore, it is an object of the present invention to enhance the sensitivity of an ultrasonic probe using a favorable dicing process, even while employing a soft backing material with a low acoustic impedance.

An ultrasonic probe according to the present invention comprises: strip-formed oscillators formed of a piezoelectric crystal material and arranged in an array form; at least three metal layers provided for the oscillators; and a backing material fixed to the oscillators through the metal layers.

In the above invention, the at least three metal layers preferably comprise, in order from the oscillator, a first metal layer based on at least one of Ti, Ni and Cr, a second metal layer based on at least one of Cu and Ni, and a third metal layer based on at least one of Cu, Au, Pt, Ag and Pd.

The second metal layer preferably has a thickness T2 lying in a range of $0.3\ \mu m \leq T2 \leq 5.0\ \mu m$, more preferably in a range of $0.5\ \mu m \leq T2 \leq 4.0\ \mu m$, and further preferably in a range of $0.8\ \mu m \leq T2 \leq 3.0\ \mu m$.

Also, an ultrasonic probe according to the present invention comprises: strip-formed oscillators formed of a piezoelectric crystal material and arranged in an array form; electrodes including a metal layer provided for the oscillators and having a Vickers hardness $V_{HN}$ which lies in the range of $30 \leq V_{HN} \leq 110$ and a thickness $T\ (\mu m)$ which lies in the range of $0.3 \leq T \leq 5.0$, and further that a product of the Vickers hardness and the thickness $V_{HN} \times T$ lies in the range of $15 \leq V_{HN} \times T \leq 400$; and a backing material fixed to the oscillators through the electrodes.

In the above invention, the metal layer preferably satisfies the condition that the thickness $T\ (\mu m)$ thereof lies in the range of $0.5 \leq T \leq 4.0$, and further that the product of the Vickers hardness and the thickness $V_{HN} \times T$ lies in the range of $25 \leq V_N \times T \leq 320$.

Further, the thickness $T\ (\mu m)$ preferably lies in the range of $0.8 \leq T \leq 3.0$, and further the product of the Vickers hardness and the thickness $V_{HN} \times T$ lies in the range of $40 \leq V_{HN} \times T \leq 240$.

Also, the metal layer is preferably based on at least one of Cu and Ni.

Further, an ultrasonic probe of the present invention comprises: strip-formed oscillators formed of a piezoelectric crystal material and arranged in an array form; and electrodes provided for the oscillators; and a backing material fixed to the oscillators through the electrodes; wherein the electrodes includes a metal layer to prevent chipping and cracking of the oscillators occurring when the piezoelectric crystal material in a plated form is diced into the strip-formed oscillators.

In the above invention, the metal layer is preferably based on at least one of Cu and Ni.

Also, in the above-stated inventions, the backing layer preferably has an acoustic impedance Zb lying in a range of $1.0 \times 10^6\ kg/m^2 s \leq Zb \leq 5.0 \times 10^6\ kg/m^2 s$.

The piezoelectric crystal material of the oscillators preferably is a perovskite type solid solution expressed by Pb $((M1_{1/3}Nb_{(2/3-(2z/3)}Ta_{2z/3})_{1-x-y}Ti_xM2_y)O_3$, wherein M1 is at least one metal selected from Zn, Ni and Mg, M2 is at least one metal selected from Pt, Fe, Bi, Rh and Ir, and x, y and z are respectively defined as $0.05 \leq x \leq 0.2, 0 \leq y \leq 0.01$ (preferably $0.00001 \leq y \leq 0.01$), $0 \leq z \leq 0.1$.

Also, the piezoelectric crystal material of the oscillators preferably is a perovskite type solid solution expressed by $Pb((M3_{1/2}Nb_{(\frac{1}{2})-(z/2)}Ta_{z/2})_{1-x-y}Ti_xM2_y)O_3$, wherein M2 is at least one metal selected from Pt, Fe, Bi, Rh and Ir, M3 is at least one metal selected from Sc and In, and x, y and z are respectively defined as $0.2 \leq x \leq 0.6, 0 \leq y \leq 0.01$ (preferably $0.00001 \leq y \leq 0.01$), $0 \leq z \leq 0.1$.

Particularly, the piezoelectric crystal material of the oscillators preferably is a perovskite type solid solution expressed by $Pb((Zn_{1/3}Nb_{(\frac{2}{3})})_{1-x}Ti_x)O_3$, wherein x is defined as $0.05 \leq x \leq 0.2$.

Further, the piezoelectric crystal material of the oscillators comprises a single crystal.

The metal layer (the second layer where the metal layer is formed by three or more metal layers) preferably has added thereto an element to prevent the metal layer from oxidizing. Particularly, at least one element of Au and Ag is preferably added. Further, the element is preferably selectively added to a surface of the metal layer.

Also, an ultrasonic diagnostic apparatus is characterized by utilizing the above-described ultrasonic probe.

DESCRIPTION OF THE PREFERRED EMBODIMENTS

Now embodiments for practicing the present invention will be explained in detail hereinbelow with reference to the drawings.

Figure 1:
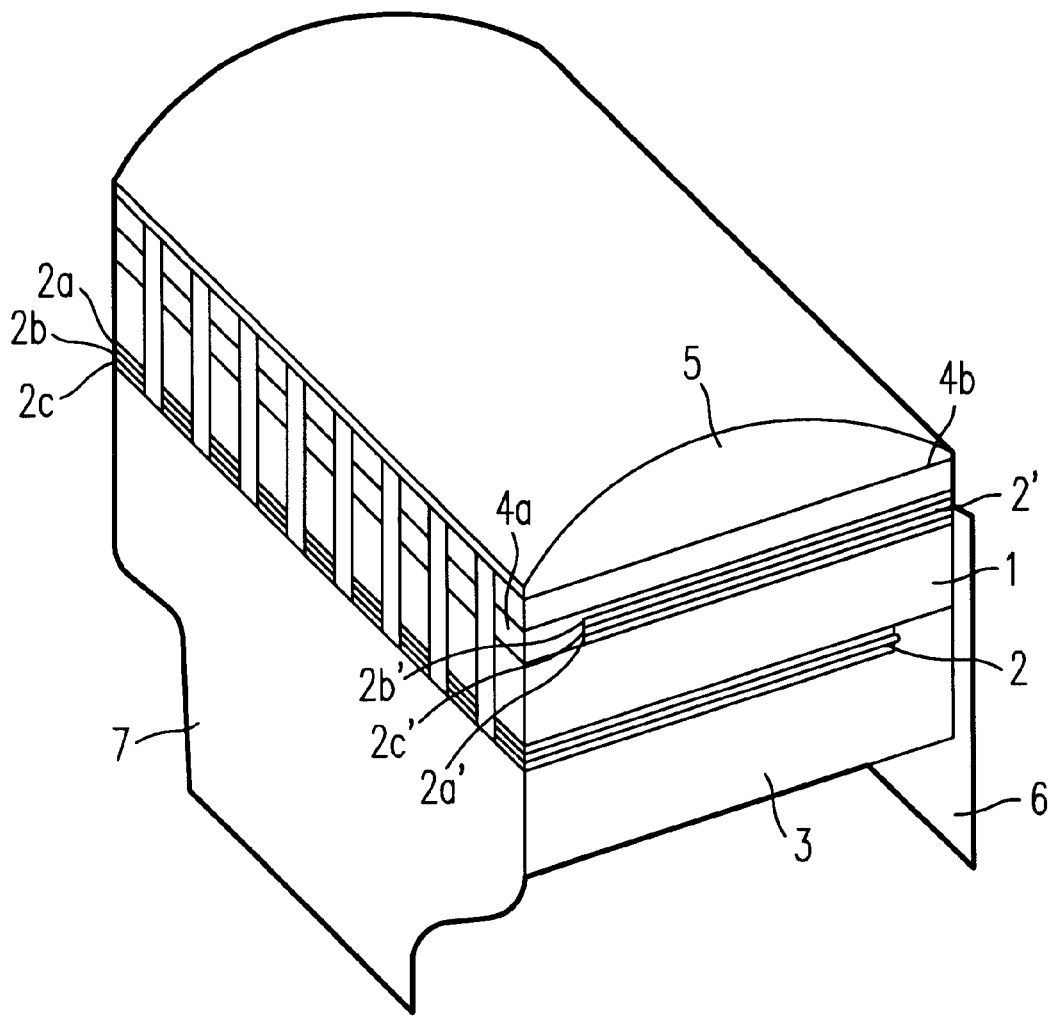
FIG. 1 is a perspective view showing a structure of an ultrasonic probe according to the present invention.
Figure 5:
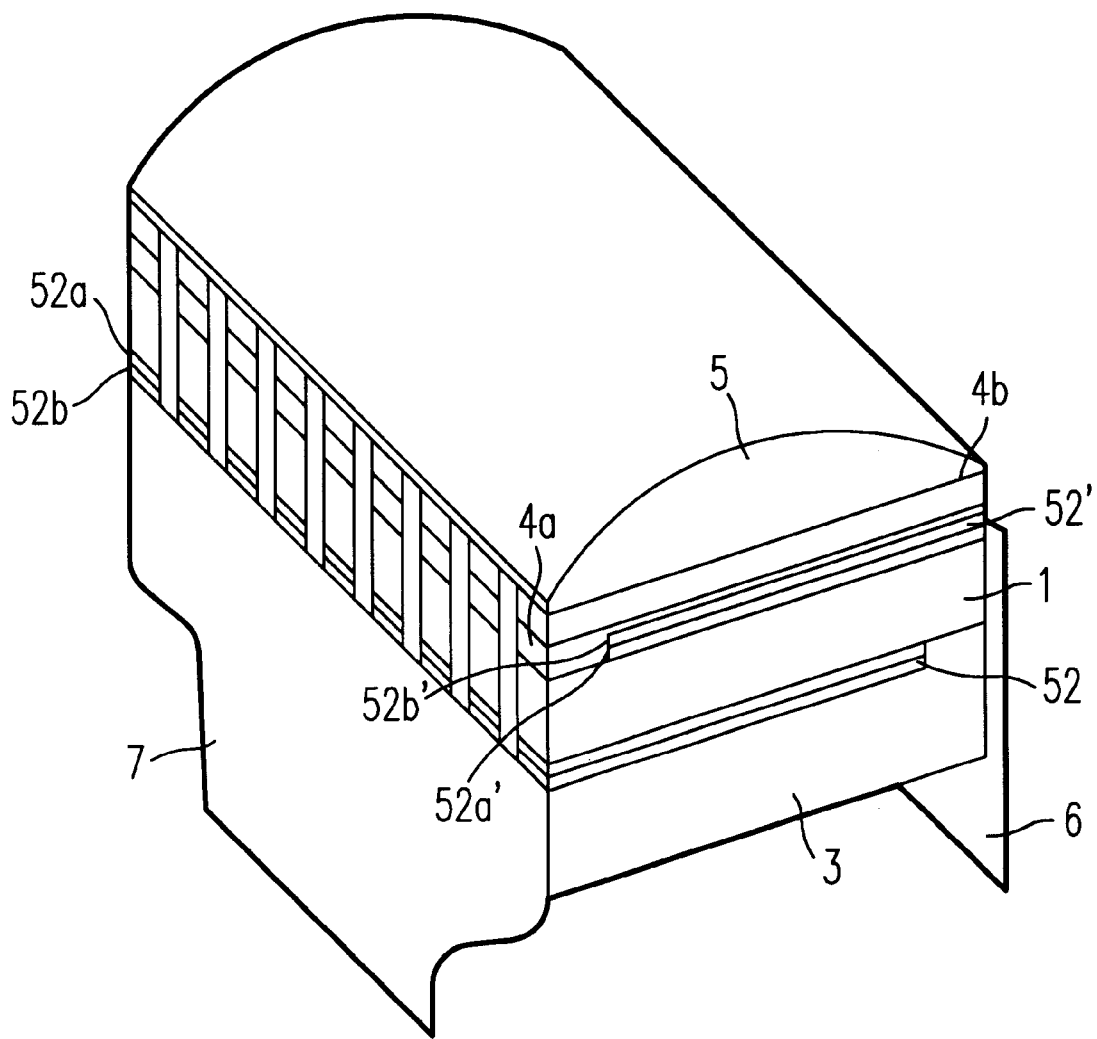
FIG. 5 is a perspective view showing a structure of an ultrasonic probe according to another embodiment of the present invention.

FIG. 1 illustrates a structural perspective view of an ultrasonic probe according to the present invention, while FIG. 5 is a structural perspective view showing another embodiment of the present invention.

As shown in FIGS. 1 and 5, the ultrasonic probe according to the present invention has electrodes 2, 2' (FIG. 1), 52, 52' (FIG. 5) formed by at least two metal layers, of predetermined hardness and thickness. In particular, a second electrode layer 2b, 2b' is a metal layer based on at least one of Cu and Ni (including an alloy layer of Cu and Ni).

With such a structure, if the backing layer, provided on the opposite side of an oscillator from an ultrasonic wave radiating surface employs a soft material with a low acoustic impedance in order to reduce residual vibration, the presence of the second layer of predetermined hardness 2b, 2b', 52b, 52b' with a predetermined thickness serves to firmly hold the oscillator against the stress caused by dicing.

Further, the second metal layer 2b, 2b', 52b, 52b' with predetermined hardness and thickness works against cutting blade loading, by scraping off the backing material adhered to the cutting blade. These factors serve to prevent cuttability from degrading during the dicing process as well as preventing cracking and chipping as is conventionally encountered. It is therefore possible to manufacture an ultrasonic probe higher in sensitivity as compared to the conventional products while maintaining high yields.

The second metal layer 2b, 2b', 52, 52' with predetermined hardness preferably employs a material based on at least one of Cu and Ni. With this structure, this effect is prominently obtained. The adhesibility of the second layer 2b, 2b' to the first layer 2a, 2a' is based on the presence of at least one of Ti, Ni and Cr, while its adhesibility to a third layer 2c, 2c' is based on the presence of at least one of Cu, Au, Pt, Ag and Pd. The first layer 2a, 2a' due to at least one of Ti, Ni and Cr has excellent adhesibility to a piezoelectric crystalline material forming the oscillator, particularly a perovskite type solid solution. The third layer 2c, 2c' due to at least one of Cu, Au, Pt, Ag and Pd has good adhesibility to other interconnect materials, enabling soldering or the like.

The thickness T2 of the metal second layer 2b, 2b' is desirably set in a range no less than 0.3 μm and no more than 5.0 μm, preferably no less than 0.5 μm and no more than 4.0 μm, more preferably no less than 0.8 μm and no more than 3.0 μm.

Where the thickness of the second layer 2b, 2b' is less than 0.3 μm, there is difficulty in suppressing the degradation in the dicing process. On the other hand, where it exceeds 5 μm, the metal layer becomes readily peeled off, or the electromechanical coupling coefficient of the oscillator is reduced causing degradation of the transmitting/receiving sensitivity, despite the fact that the degradation of dicing process can be fully suppressed.

Also, concerning the relationship between hardness and thickness of the metal layer 2b, 2b', 52b, 52b', electrodes may be used which include a metal layer satisfying the relationship that a Vickers hardness $V_{HN}$ thereoflies in the range of $30 \leq V_{HN} \leq 110$ and a thickness T (μm) thereof lies in the range of $0.3 \leq T \leq 5.0$, and further that a product of the Vickers hardness and the thickness $V_{HN} \times T$ lies in the range of $15 \leq V_{HN} \times T \leq 400$. With this structure, the above effect can be obtained. If the values are less than the lower limits of the ranges, the suppression of the degradation of the dicing process does not work well. On the other hand, if the values exceed the upper limits, the metal layer 2b, 2b', 52b, 52b' tends to be peeled off or the transmitting/receiving sensibility tends to be lowered due to the degradation in the electromechanical coupling coefficient of the oscillator, despite the fact that the degradation in the dicing process is fully suppressed.

Here, the thickness T (μm) preferably lies in the range of 0.5≤T≤4.0 and the product of the Vickers hardness and the thickness $V_{HN} \times T$ lies in the range of $25 \leq V_{HN} \times T \leq 320$, more preferably the thickness T lies in the range of 0.8≤T≤3.0 and the product of the Vickers hardness and the thickness $V_{HN} \times T$ lies in the range of $40 \leq V_{HN} \times T \leq 240$.

Also, the backing material 3 preferably employs a material having an acoustic impedance Zb lying in a range of $1.0 \times 10^6$ kg/m²s≤Zb≤$5.0 \times 10^6$ kg/m²s. This makes it possible to obtain an ultrasonic probe with a high sensitivity as compared to one employing a conventional backing material having an acoustic impedance exceeding $5.0 \times 10^6$ kg/m²s.

If the acoustic impedance of the backing material is less than $1.0 \times 10^6$ kg/m²s, it becomes difficult to fully obtain the effect of suppressing residual vibration on the oscillator, so the resolution of the probe tends to be degraded. On the other hand, if the acoustic impedance exceeds $5.0 \times 10^6$ kg/m²s, the residual vibration on the oscillator is fully suppressed but the probe sensitivity tends to be greatly degraded.

Figure 9A:
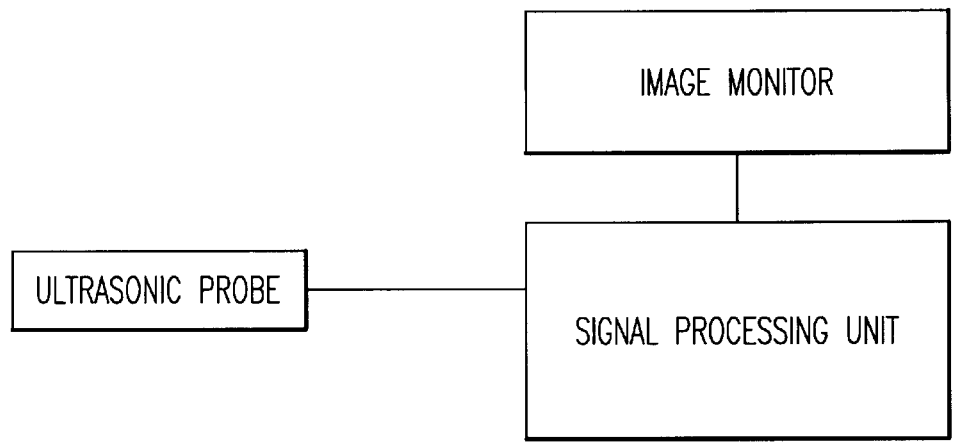
FIG. 9 is a schematic view showing a structure of an ultrasonic diagnostic apparatus of the present invention.
Figure 9B:
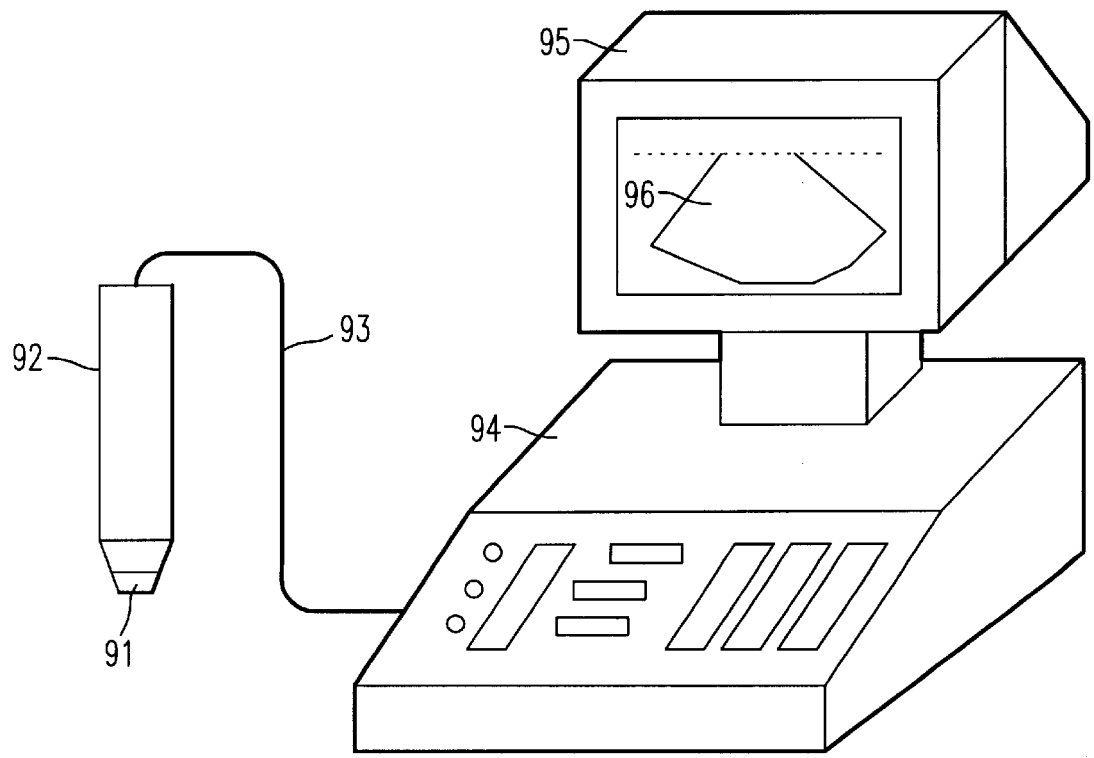

FIG. 9 is a schematic view showing a structure of an ultrasonic diagnostic apparatus of the present invention. As shown in FIG. 9A, a signal, obtained through the ultrasonic probe of the present invention described in the above embodiment, is transmitted to a signal processing unit. By processing the signal in this signal processing unit, images are displayed on an image monitor. This apparatus has the structure shown in FIG. 9B, wherein one end of a cable 93 is connected to the ultrasonic probe 92 provided with a piezoelectric member 91, and another end of this cable 93 is connected to the signal processing unit 94. A signal obtained from the ultrasonic probe 92 is transmitted through a cable 93 to the signal processing unit 94, and processed by this signal processing unit 94. The result of the signal processing is displayed as an ultrasonic image on an image monitor 96.

EXAMPLE 1

An ultrasonic probe was prepared using a piezoelectric single crystal of lead zinc niobate titanate (Pb ((Zn$_{1/3}$Nb$_{(2/3)}$)$_{1-x}$Ti$_x$)O$_3$(x lies in the range of 0.05≤x≤0.2). PbO, ZnO, Nb$_2$O$_5$ and TiO$_2$ having a purity of 99.99% or higher by weight were used as the single crystal material so that lead zinc niobate and lead titanate were brought to a molar ratio of 91:9. A flax material PbO was added in an amount of 1.2 times the single crystal material.

This mixture was fully mixed by a mixer for 20 minutes and poured into a platinum crucible, and then heated up to 1270° C. in an electric furnace and kept for 10 hours. Thereafter, the molten mixture was gradually cooled at a rate of 1° C./h to 900° C., and then allowed to cool to a room temperature.

Then, a single crystal and flax in a solid form was taken out of the crucible and the flax was broken to remove the inner single crystal bulk. A single crystal in a rounded parallelepiped form with a side dimension of 35 mm was obtained. It was confirmed by x-ray diffraction that the crystal was of a perovskite structure. The single crystal was placed in an orientation of <001> while observing it using a Laue camera, and sliced vertically to the <001> orientation of the crystal (parallel to (100) plane of the crystal) using a diamond cutter to a thickness of 1 mm. Thus, a (001) wafer with a side dimension of about 25 mm was obtained.

Then, a piezoelectric oscillator was formed by providing electrodes having two metal layers, in order to measure the electromechanical coupling constant k33'. The opposite surfaces of the (001) wafer were abraded (rapped) using an abrasive of #2000 to a thickness of 0.24 mm. Two metal layers were formed by metallization with sputtering on the opposite surfaces of the piezoelectric member, thereby providing electrodes. Thus, a piezoelectric oscillator was formed in a flat-plate form. The electrodes were formed from a 0.05 μm thick Ti layer and a 0.2 μm thick Au layer, in the order listed starting with the piezoelectrics.

Ten strip-formed oscillators, having a size of 12 mm wide×14 mm long×0.24 mm thick, were cut out of the flat-plate piezoelectric oscillator, and then subjected to an electric field of 600 V/mm in a silicone oil at 210° C. for 10 minutes. A poling process was performed by cooling down to 40° C. with the electric field maintained. Thereafter, the piezoelectric oscillator was measured for an electromechanical coupling coefficient k33'. As a result, k33'=84% on average was obtained.

Now an explanation will be made about the method of preparing an ultrasonic probe having a piezoelectric oscillator with electrodes of three metal layers. FIG. 1 illustrates a perspective view of an ultrasonic probe having the structure of this method. Another (001) wafer cut out of the above-stated single crystal bulk, was abraded at its opposite surfaces by an abrasive of #2000 to a thickness of 240 μm, and three metal layers were formed by metallization with sputtering on the opposite surface of the piezoelectric material 1 thus providing electrodes 2, 2'. The electrodes were formed from 0.05 μm thick Ti layers 2a, 2a', 1.0 μm thick Cu layers 2b, 2b', and 0.2 μm Au layers 2c, 2c', in the order listed starting with the piezoelectric material.

Then, the electrodes 2, 2' and the piezoelectric material 1 were diced with a dicing saw into a size of 20 mm wide×14 mm long×0.24 mm thick, thus obtaining a rectangular-plate oscillator. This rectangular-plate oscillator was subjected to an electric field of 600 V/mm in a silicone oil at 210° C. for 10 minutes, and cooled down to 40° C. with the electric field maintained, performing a poling process. Thereafter, a measurement on the electromechanical coupling coefficient kt was made, and kt=54% was obtained.

Then, the rectangular-plate oscillator was soldered on one surface with a 128 ch flexible printed circuit (FPC) 7 and on the other surface with a copper-foil ground electrode plate 6. The electrodes at the back of the soldered portions were etched.

Then, a backing material 3, formed of a mixture of rubber and resin and having an acoustic impedance of $2.2 \times 10^6$ kg/cm²s was adhered to the FPC-fixed surface, while a matching layer 4a, 4b was adhered to the surface having the ground electrode plate 7. The matching layer 4a, 4b had an acoustic impedance varying gradually in a direction from the rectangular-plate oscillator to the acoustic lens 5, described later, such that the acoustic impedance approaches that of the acoustic lens 5.

Then, the matching layer 4a, 4b and the rectangular-plate oscillator (electrodes 2, 2' and piezoelectric material 1) were diced into 128 channels to a depth of 400 μm by using a 30 μm width cutting blade in a manner matched to a channel pitch (150 μm) of the FPC 7. At this time, the backing material was cut to a depth of about 50 μm. Further, an acoustic lens 5 was adhered to the matching layer 4b thereby forming an ultrasonic probe as shown in FIG. 1.

This ultrasonic probe was measured in regard to reflected echoes by a pulse echo method. As a result, an echo having a center frequency of 3.55 MHz was received from each of the 128 channels. The variation of frequency was within 0.15 MHz. Also, a −6 dB fractional bandwidth was 102% in average. For comparison with the present probe, another probe was fabricated of the same material and specification except for using a backing material based on ferrite rubber and having an acoustic impedance of $5.5 \times 10^6$ kg/m²s. This probe was measured in regard to echo level, and it was confirmed that it improved sensitivity by 3–5 dB.

A −6 dB fractional bandwidth was a little narrower as compared to 106% of the probe using the backing material with the acoustic impedance $5.5 \times 10^6$ kg/m²s, but the difference therebetween was only slight. This band had a value with which a Doppler reference frequency could be set over a wider range than a conventional probe using PZT ceramics.

Then, comparison was made between an ultrasonic probe using an electrode formed by two metal layers and an ultrasonic probe utilizing an electrode formed by three metal layers according to the present invention. The ultrasonic probe of the present invention obtained by the above method was immersed in an epoxy stripping solution to strip off the backing material 3, the acoustic matching layer 4a, 4b, and so on from the strip-formed piezoelectric oscillator, Thus a strip-formed piezoelectric oscillator single element was obtained.

Figure 3A:
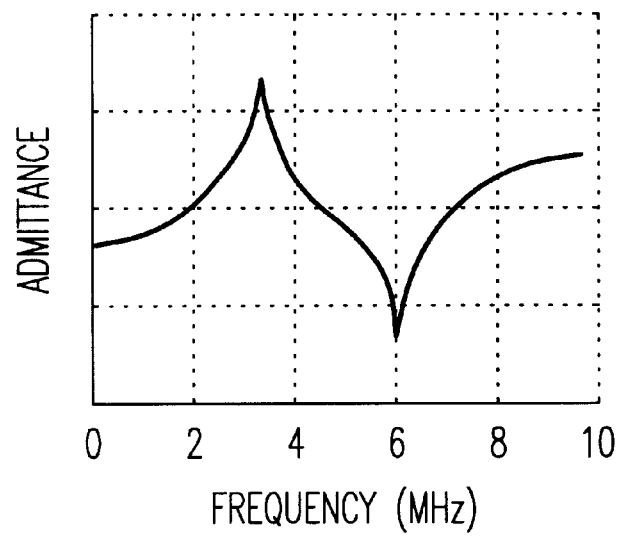
FIG. 3 is a characteristic diagram showing admittance spectrum of piezoelectric oscillators of the present invention and of conventional ones.

The obtained oscillator was measured on k33'. As a result, k33'=84% was obtained on average on 128 channels, and there was exhibited a value equivalent to that of k33', of the piezoelectric oscillator having two layers of Ti and Au as stated before. Further, the admittance frequency spectrum was free of spurious values, as shown in FIG. 3A. Due to this, it was confirmed that, in the ultrasonic probe of the present invention, the increase in thickness of the electrode layers 2, 2' had no effect upon k33'.

Figure 2A:
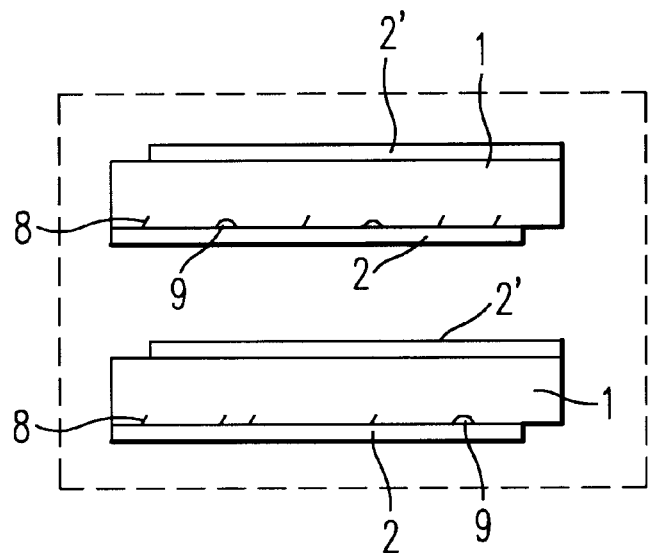
FIG. 2 is a sectional view showing chipping, cracking and disconnection on piezoelectric oscillators of the present invention and on conventional ones.

Also, the ultrasonic probe piezoelectric oscillator of the present invention was observed at its end surfaces by using a microscope. As a result, as shown in FIG. 2A, it was confirmed that there was no disconnection on every channel and the occurrence of cracking 8 and chipping 9 was only to a sight extent.

COMPARATIVE EXAMPLE 1

Using a (001) wafer cut out of the same single crystal bulk as in example 1, abrasion was performed in a similar manner. Three metal layers were metallized by sputtering on respective surfaces of a piezoelectric material, providing electrodes. The electrode 12, 12' was formed, in the order listed starting with the piezoelectric material 11, by a Ti layer with a thickness of 0.05 μm, a Cu layer with a thickness of 0.2 μm, and an Au layer with a thickness of 0.2 μm. A rectangular-plate piezoelectric oscillator of a size of 20 mm wide×14 mm long×0.24 mm thick was cut out of the (001) wafer provided with the electrodes 12, 12', and then subjected to a poling process as in Example 1.

Then, an FPC and a ground electrode plate are fixed, and subsequently electrode etching was performed in a manner similar to Example 1. Further, a backing material formed of a mixture of rubber and resin and having an acoustic impedance of $2.2 \times 10^6$ kg/m²s was adhered to the FPC-fixed surface. Thereafter, adhesion of a matching layer, the dicing process of the piezoelectric oscillator to 128 channels, and adhesion of an acoustic lens were made similarly to those of Example 1, thereby forming an ultrasonic probe.

This ultrasonic probe was measured in regard to reflected echoes by the pulse echo method. As a result, it was found that 13 channels, among 128 channels, were impossible to measure on echoes and thus was poor in quality. From the remaining channels, an echo having a center frequency of 3.60 MHz was received. The variation of frequency was within 0.25 MHz. Also, a −6 dB fractional bandwidth was 92% on average except for the poor channels.

Figure 3B:
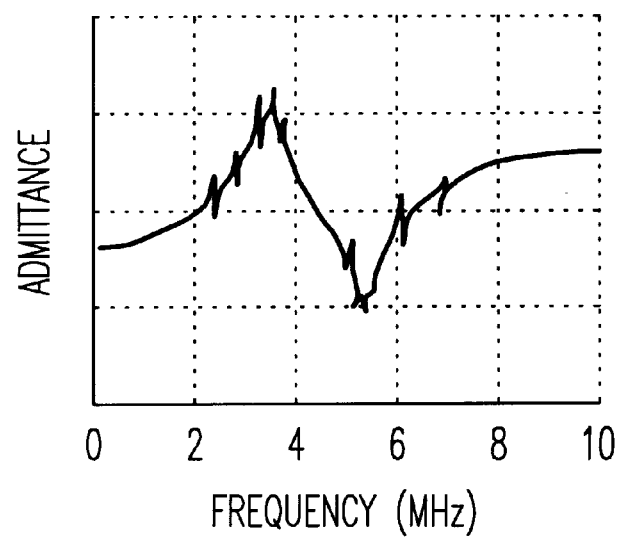

Then, this probe was immersed in an epoxy stripping solution and k33' was measured similarly to Example 1. As a result, k33 '=79% was obtained on average over 115 channels except for the poor elements. Further, the admittance frequency spectrum exhibited many spurious values as shown in FIG. 3B, and there were many elements in which resonant frequencies or anti-resonant frequencies were not observed clearly.

Figure 2B:
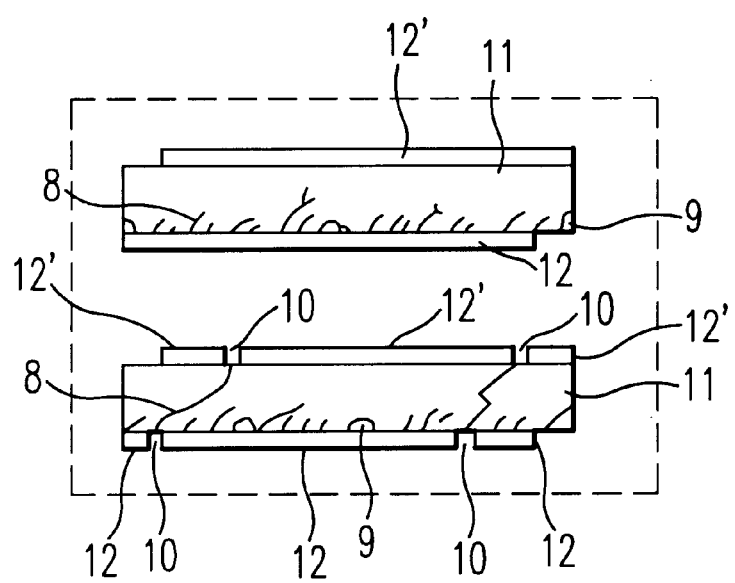

Also, the end surfaces of this probe were observed by using a microscope. As shown in FIG. 2B, much cracking 8 and chipping 9 was observed on every channel due to dicing. As for the oscillator on the channel where echoes could not be measured, the electrodes 12, 12', on the opposite sides of the piezoelectric material 11 had a disconnection 10 caused by cracking.

EXAMPLE 2

This example will be explained also with reference to FIG. 1 as explained in Example 1. Using a (001) wafer cut from the same single crystal bulk as in Example 1, abrasion was similarly made. Three metal layers were metallized by sputtering on opposite surfaces of the piezoelectric material 1 to thereby form electrodes. The electrodes were formed, in the order listed starting with the piezoelectric material from 0.05 μm thick Ti layers 2a, 2a', 2.0 μm thick Cu layers 2b, 2b', and 0.2 μm thick Au layers 2c, 2c'.

A rectangular-plate oscillator with a size of 12 mm wide×14 mm long×0.24 mm thick was cut out of the (001) wafer provided with the electrodes, and then subjected to a poling process in a manner similar to Example 1. Then, adhesion of an FPC 7 and a ground electrode plate 6 as well as electrode etching were performed similarly to Example 1.

Then, a backing material 3 formed based on chloroprene rubber and having an acoustic impedance of $3.5 \times 10^6$ kg/m²s was adhered to the FPC-fixed surface. Thereafter, adhesion of a matching layer 4a, 4b, a dicing process of the piezoelectric oscillator into 128 channels, adhesion of an acoustic lens 5 and the like were made similarly to Example 1, thereby forming an ultrasonic probe.

This ultrasonic probe was measured in regard to reflected echoes by the pulse echo method. As a result, an echo having a center frequency of 3.46 MHz was received from every element. The variation of frequency was within 0.15 MHz. A −6 dB fractional bandwidth was 104% on average. It was confirmed that the echo level was improved in sensitivity by 2–4 dB as compared to an ultrasonic probe using a backing material with an acoustic impedance of $5.5 \times 10^6$ kg/m²s prepared for comparison purposes.

A −6 dB fractional bandwidth was a little narrow as compared to 106% of the ultrasonic probe using the backing material of an acoustic impedance of $5.5 \times 10^6$ kg/m²s. However, the difference was only slight. This band had a value with which a Doppler reference frequency could be measured over a wider range than that of the conventional probe using PZT ceramics.

Then, in order to compare the ultrasonic probe using two-layered metal electrodes with the ultrasonic probe of the present invention having a three-layered metal electrodes, the ultrasonic probe of the present invention obtained in the above method was immersed in an epoxy stripping solution to strip off the backing material 3 and the acoustic matching layer 4a, 4b. Thus, a strip-formed piezoelectric oscillator was obtained.

The obtained oscillator was measured on k33'. As a result, k33'=83% on average was obtained on 128 channels. Thus, there was exhibited an equivalent value to that of k33' of the piezoelectric oscillator having the Ti and Au two-layered electrodes. It was confirmed that in the present invention no influence was given on k33' due to an increase in the thickness of the electrode layer $2b$, $2b'$ to $2.0\,\mu$m. Further, the admittance frequency spectrum was also favorable with no spurious values as in Example 1.

Also, this probe was observed at its end surfaces by using a microscope. As a result, it was confirmed that there was no disconnection on any channel as in Example 1, and the occurrence of cracking or chipping was extremely slight.

COMPARATIVE EXAMPLE 2

Using a (001) wafer cut from the same single crystal bulk as in Example 1, abrasion is similarly made. Three metal layers were metallized by sputtering on opposite surfaces of the piezoelectric material 1 to thereby form electrodes. The electrodes were structured, in the order listed starting with the piezoelectric material, by $0.05\,\mu$m thick Ti layers, $6.0\,\mu$m thick Cu layers, and $0.2\,\mu$m thick Au layers, A rectangular-plate oscillator with a size of 20 mm wide×14 mm long×0.24 mm thick was cut out of the (001) wafer provided with the electrodes, and then subjected to poling process in a manner similar to Example 1.

Then, adhesion of an FPC and a ground electrode plate as well as electrode etching were performed, similarly to Example 1. Then, a backing material formed based on chloroprene rubber and having an acoustic impedance of $2.2\times10^6$ kg/m$^2$s was adhered to the FPC-fixed surface. Thereafter, adhesion of a matching layer, a dicing process of the piezoelectric oscillator into 128 channels, adhesion of an acoustic lens and the like were made similarly to Example 1, thereby forming an ultrasonic probe.

However, troubles were frequently encountered wherein the electrode layer peeled off from the piezoelectric material, thus greatly reducing the yield. It can be considered that this peeling-off tendency is due to the excessive thickness of the second electrode layer and excessive large stress caused by the difference in thermal shrinkage relative to other electrode layers or the piezoelectric material.

Figure 4:
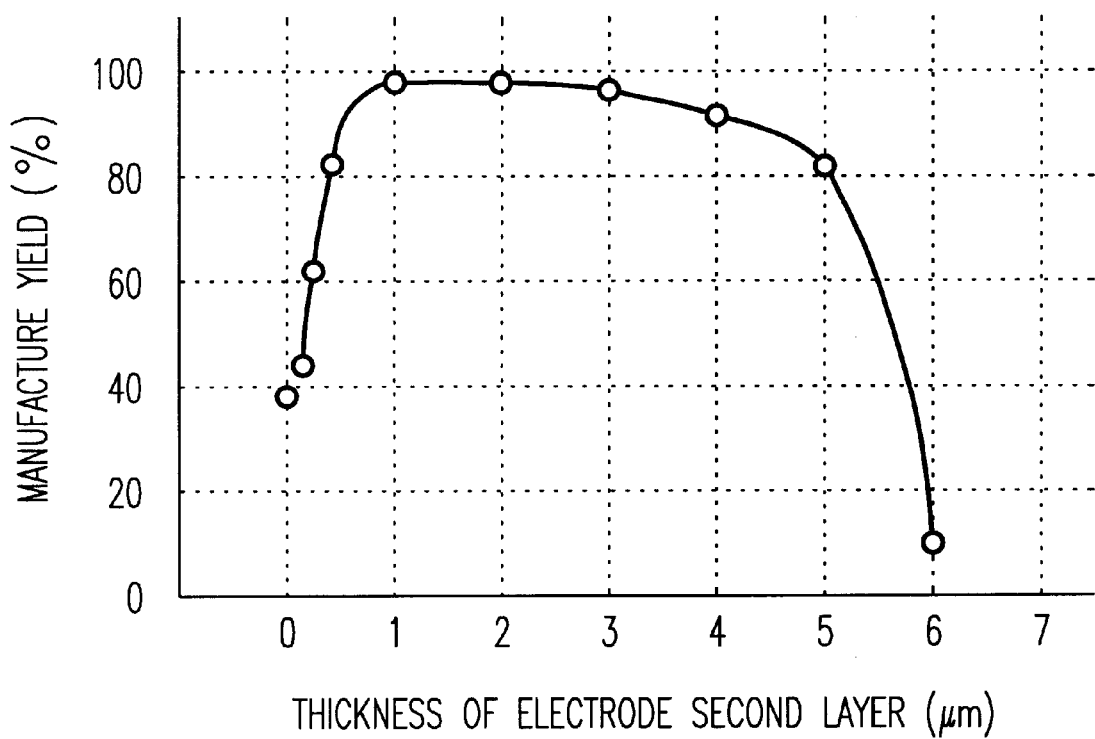
FIG. 4 is a characteristic diagram showing a relationship between a thickness of the second layer of an electrode and a manufacture yield of ultrasonic probes.

FIG. 4 is a characteristic diagram showing a relationship between the thickness of the electrode second layer and the manufacture yield of the ultrasonic probes. As shown in this diagram, it was found that the yield was abruptly degraded when the thickness of the electrode second layer has a value in the range of less than $0.3\,\mu$m or exceeding $5.0\,\mu$m.

EXAMPLE 3

This embodiment is concerned with an ultrasonic probe having two-layered metal electrodes formed on opposite surfaces of a piezoelectric material to which the present invention was applied.

FIG. 5 is a perspective view showing a structure of an ultrasonic probe according to this Example 3, in which no detailed explanation is given for parts having the same symbols as in FIG. 1.

Using a (001) wafer cut from the same single crystal bulk as in Example 1, abrasion was similarly made. Two metal layers were metallized by sputtering on opposite surfaces of the piezoelectric material 1 to form electrodes. The electrodes were structured, in the order listed starting with the piezoelectric material, by $0.05\,\mu$m thick Ti layers 52, 52', and $1.5\,\mu$m thick Cu layers 52b, 52b'.

Figure 6:
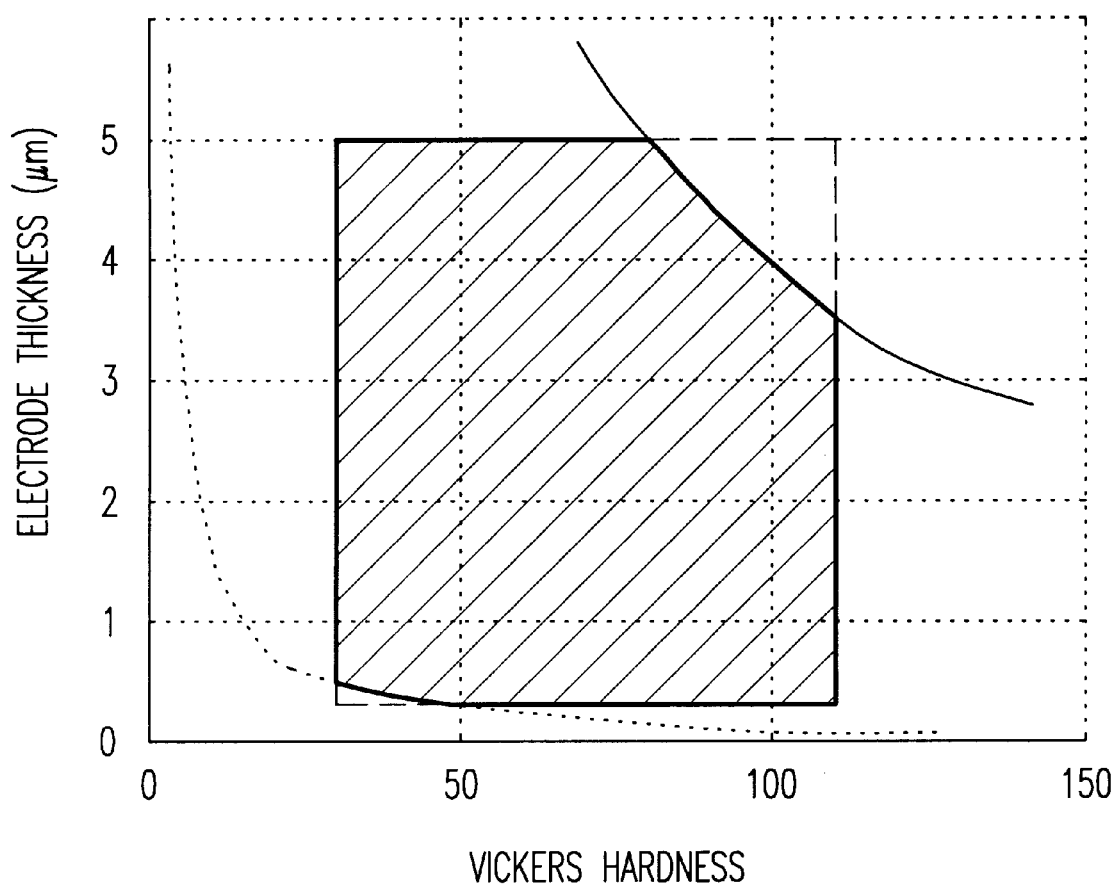
FIG. 6 is a characteristic diagram showing a relationship between the hardness and the thickness of an electrode of an ultrasonic probe according to the present invention.

This Cu layer had a Vickers hardness ($V_{HN}$) of 50 (unitless) and its thickness was 1.5 ($\mu$m). The layer was structured so as to satisfy respective conditions of $30 \leq V_{HN} \leq 110$ and $0.3 \leq T \leq 5.0$, and further such that the product of hardness and thickness ($V_{HN} \times T$) lay within a range $15 \leq V_{HN} \times T \leq 400$. FIG. 6 is a characteristic diagram that illustrates a range in which the above conditions are satisfied.

A rectangular-plate oscillator with a size of 20 mm wide×14 mm long×0.24 mm thick was cut out of the (001) wafer provided with the electrodes, and then subjected to a poling process in a manner similar to Example 1. Then, adhesion of an FPC 7 and a ground electrode plate 6 as well as electrode etching were performed, similarly to Example 1.

Then, a backing material 3 formed based on a mixture of rubber and resin and having an acoustic impedance of $2.2\times10^6$ kg/m$^2$s was adhered to the FPC-fixed surface. Thereafter, adhesion of a matching layer 4a, 4b, a dicing process of the piezoelectric oscillator into 128 channels, adhesion of an acoustic lens 5 and the like were made similarly to Example 1, thereby forming an ultrasonic probe.

This ultrasonic probe was measured in regard to reflected echoes by the pulse echo method. As a result, an echo having a center frequency of 3.50 MHz was received from every element. The variation of frequency was within 0.14 MHz. A A −6 dB fractional bandwidth was 102% on average. It was confirmed that the echo level is improved in sensitivity by 3–5 dB as compared to the above-mentioned ultrasonic probe using the backing material with an acoustic impedance of $5.5\times10^6$ kg/m$^2$s.

A −6 dB fractional bandwidth was a little narrow as compared to 106% of the ultrasonic probe using the backing material of an acoustic impedance of $5.5\times10^6$ kg /m$^2$s. However, the difference was slight. This band had a value with which a Doppler reference frequency could be measured over a wider range than that of the conventional probe using PZT ceramics.

Then, in order to compare the ultrasonic probe using Ti and Au two-layered metal electrodes with an ultrasonic probe of the present invention having two-layered metal electrodes, the ultrasonic probe of the present invention obtained in the above method was immersed in an epoxy stripping solution to strip off the backing material 3 and the acoustic matching layer 4a, 4b from the strip-formed piezoelectric oscillator. Thus, a strip-formed piezoelectric oscillator single element was obtained.

The obtained oscillator was measured on k33'. As a result, k33'=84% on average was obtained on 128 channels. Thus, an equivalent value to that of k33' of the above-mentioned piezoelectric oscillator having the Ti and Au two-layered electrodes was obtained. It was confirmed that in the ultrasonic probe of the present invention no influence was given on k33', due to an increase in the thickness of the electrode layer 52b, 52b' to $1.5\,\mu$m. Further, the admittance frequency spectrum had no spurious values as in Example 1.

Also, the end surfaces of the ultrasonic probe of the present invention were observed by using a microscope. It was confirmed that there were no disconnection on any channel and the occurrence of cracking and chipping was slight, similarly to Example 1.

As stated above, the electrode was structured so that its layer satisfies the respective conditions of $30 \leq V_{HN} \leq 110$ and $0.3 \leq T \leq 5.0$, and further the product of hardness and thickness ($V_{HN} \times T$) lay within a range $15 \leq V_{HN} \times T \leq 400$. This prevents the conventionally-encountered cracking and chipping from occurring in the oscillator. It was therefore possible to manufacture an ultrasonic probe improved in sensitivity over the conventional one with a high yield.

Figure 7:
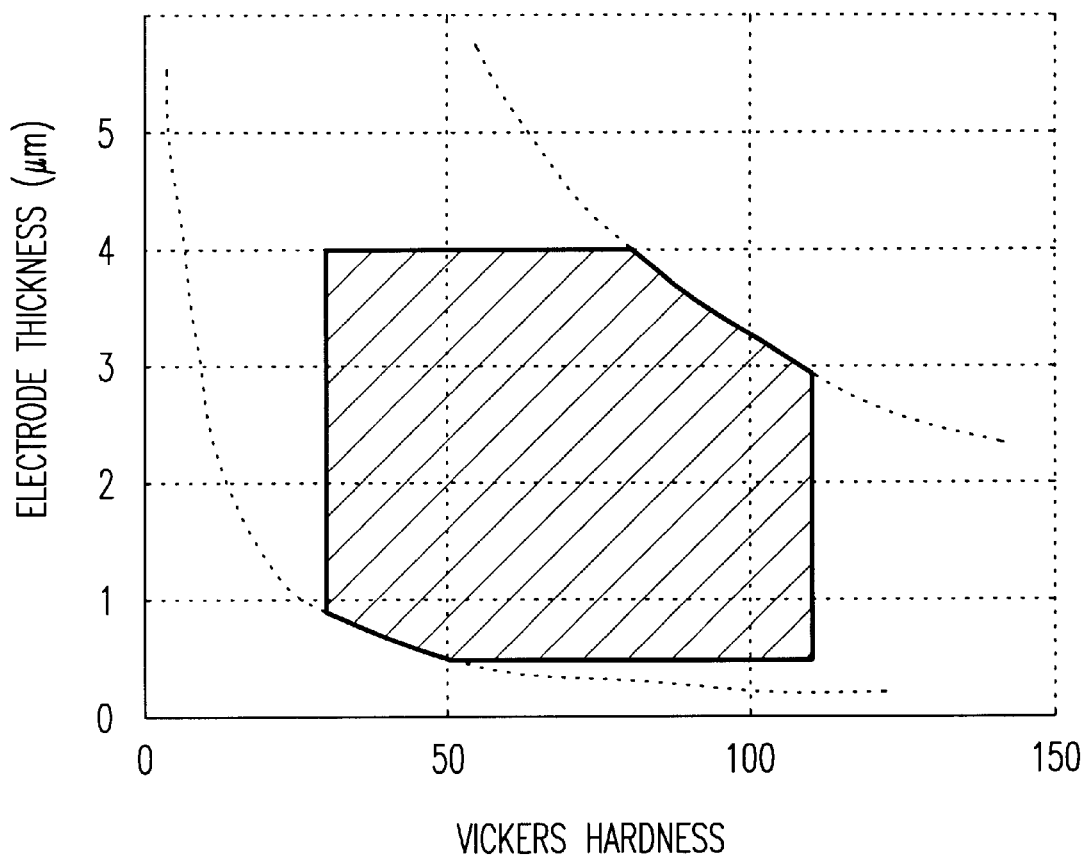
FIG. 7 is a characteristic diagram showing a preferable relationship between the hardness and the thickness of an electrode of an ultrasonic probe according to the present invention.

FIG. 7 is a characteristic diagram showing a preferred relationship between hardness and thickness of an electrode for an ultrasonic probe according to the present invention. As shown in FIG. 7, it is preferred that the thickness T satisfies $0.5 \leq T \leq 4.0$ and the product of Vickers hardness and thickness $V_{HN} \times T$ satisfies $25 \leq V_{HN} \times T \leq 320$.

Figure 8:
FIG. 8 is a characteristic diagram showing a more preferable relationship between the hardness and the thickness of an electrode of an ultrasonic probe according to the present invention.

FIG. 8 is a characteristic diagram showing a further preferred relationship between hardness and thickness of an electrode for an ultrasonic probe according to the present invention. More preferably, the thickness T satisfies $0.8 \leq T \leq 3.0$ and the product of Vickers hardness and thickness $V_{HN} \times T$ satisfies $40 \leq V_{HN} \times T \leq 240$. The above conditions can be applied to two-layered electrodes, and further to three-layered electrodes.

The two-layered electrode is preferably added with an element to prevent the overlying metal layer from oxidizing. Such an element is preferably added selectively to a surface side of the metal layer.

Where the metal layer is a layer based on at least one of Cu and Ni, the metal layer is preferably added with at least one element of Au and Ag.

Where the above element is selectively added to the surface of the metal layer, the added portion have a depth, for example, of 5 nm–50 nm from the surface of the metal layer. Also, the concentration of the added element at the metal layer surface can be, for example, in 50 wt %–75 wt %.

Also, it is possible to use Al or an alloy thereof, e.g., an Al-Si alloy, for the second layer or an electrode having a predetermined hardness. An electrode layer formed of this material is also good in adhesibility to the other interconnect materials, and can be soldered thereto.

Although the embodiments of the present invention were described hereinabove, the present invention is not limited to these embodiments. For example, the invention is applicable, besides the above-described ultrasonic probe and ultrasonic diagnostic apparatus, also to other ultrasonic transmitting/receiving devices or ultrasonic transmitting devices for lithotripter and so on. Besides, the present invention can be embodied in various modified forms without departing from a subject matter of the invention.

Obviously, numerous modifications and variations of the present invention are possible in light of the above teachings. It is therefore to be understood that within the scope of the appended claims, the invention may be practiced otherwise than as specifically described herein.

What is claimed is:

1. An ultrasonic probe comprising:
    strip-formed oscillators formed of a piezoelectric crystal material and arranged in an array form;
    electrodes including a metal layer provided for said oscillators and satisfying the condition that a Vickers hardness $V_{HN}$ thereof lies in the range of $30 \leq V_{HN} \leq 110$ and a thickness T ($\mu$m) thereof lies in the range of $0.3 \leq T \leq 5.0$, and further a product of the Vickers hardness and the thickness $V_{HN} \times T$ lies in the range of $15 \leq V_{HN} \times T \leq 400$; and a backing material fixed to said oscillators through said electrodes.

2. An ultrasonic probe according to claim 1, wherein said metal layer satisfies the condition that the Vickers hardness $V_{HN}$ lies in the range of $30 \leq V_{HN} \leq 110$ and the thickness T ($\mu$m) lies in the range of $0.5 \leq T \leq 4.0$, and further that the product of the Vickers hardness and the thickness $V_{HN} \times T$ lies in the range of $25 \leq V_{HN} \times T \leq 320$.

3. An ultrasonic probe according to claim 1, wherein said metal layer satisfies the condition that the Vickers hardness $V_{HN}$ lies in the range of $30 \leq V_{HN} \leq 110$ and the thickness T ($\mu$m) lies in the range of $0.8 \leq T \leq 3.0$, and further the product of the Vickers hardness and the thickness $V_{HN} \times T$ lies in $40 \leq V_{HN} \times T \leq 240$.

4. An ultrasonic probe according to claim 1, wherein said metal layer is at least one of Cu and Ni.

5. An ultrasonic probe according to claim 1, wherein said metal layer has added thereto an element to prevent said metal layer from oxidizing.

6. An ultrasonic probe according to claim 5, wherein said element is selectively added to a surface of said metal layer.

7. An ultrasonic probe according to claim 1, wherein said metal layer has added thereto at least one element of Au and Ag.

8. An ultrasonic probe according to claim 1, wherein said backing material has an acoustic impedance Zb lying in a range of $1.0 \times 10^6$ kg/m$^2$s $\leq$ Zb $\leq 5.0 \times 10^6$ kg/m$^2$s.

9. An ultrasonic probe according to claim 1, wherein said piezoelectric crystal material is a perovskite type solid solution expressed by Pb $((M1_{1/3}Nb_{(2/3)-(2z/3)}Ta_{2z/3})_{1-x-y}Ti_xM2_y)O_3$, wherein M1 is at least one metal selected from Zn, Ml and Mg, M2 is at least one metal selected from Pt, Fe, Bi, Rh and Ir, and x, y and z are respectively defined as $0.05 \leq x \leq 0.2, 0 \leq y \leq 0.01, 0 \leq z \leq 0.1$.

10. An ultrasonic probe according to claim 1, wherein said piezoelectric crystal material is a perovskite type solid solution expressed by Pb $((M3_{1/2}Nb_{(1/2)-(z/2)}Ta_{(z/2)})_{1-x-y}Ti_xM2_y)O_3$, wherein M2 is at least one metal selected from Pt, Fe, Bi, Rh and Ir, M3 is at least one metal selected from Sc and In, and x, y and z are respectively defined as $0.2 \leq x \leq 0.6, 0 \leq y \leq 0.01, 0 \leq z \leq 0.1$.

11. An ultrasonic probe according to claim 1, wherein said piezoelectric crystal material is a perovskite type solid solution expressed by Pb $((Zn_{1/3}Nb(2/3))_{1-x} Ti_x)O_3$, wherein x is defined as $0.05 \leq x \leq 0.2$.

12. An ultrasonic probe according to claim 1, wherein said piezoelectric crystal material comprises a single crystal.

13. An ultrasonic diagnostic apparatus comprising:
    strip-formed oscillators formed of a piezoelectric crystal material and arranged in an array form; and
    electrodes including a metal layer provided on said oscillators and satisfying the condition that a Vickers hardness $V_{HN}$, thereof lies in a range of $30 \leq V_{HN} \leq 110$ and a thickness T ($\mu$m) thereof lies in a range of $0.3 \leq T \leq 5.0$, and further a product of the Vickers hardness and the thickness $V_{HN} \times T$ lies in a range of $15 \leq V_{HN} \times T \leq 400$.

14. An ultrasonic diagnostic apparatus according to claim 13, wherein said metal layer satisfies the condition that the Vickers hardness $V_{HN}$ lies in the range of $30 \leq V_{HN} \leq 110$ and the thickness T ($\mu$m) lies in the range of $0.5 \leq T \leq 4.0$, and further the product of the Vickers hardness and the thickness $V_{HN} \times T$ lies in the range of $25 \leq V_{HN} \times T \leq 320$.

15. An ultrasonic diagnostic apparatus according to claim 13, wherein said metal layer satisfies the condition that the Vickers hardness $V_{HN}$ lies in the range of $30 \leq V_{HN} \leq 110$ and the thickness T ($\mu$m) lies in the range of $0.8 \leq T \leq 3.0$, and further the product of the Vickers hardness and the thickness $V_{HN} \times T$ lies in the range of $40 \leq V_{HN} \times T \leq 240$.

16. An ultrasonic diagnostic apparatus according to claim 13, wherein said metal layer comprises at least one of Cu and Ni.

17. An ultrasonic diagnostic apparatus according to claim 13, wherein said metal layer has added thereto an element to prevent said metal layer from oxidizing.

18. An ultrasonic diagnostic apparatus according to claim 17, wherein said element is selectively added to a surface of said metal layer.

19. An ultrasonic diagnostic apparatus according to claim 13, wherein said metal layer has added thereto at least one element of Au and Ag.

20. An ultrasonic diagnostic apparatus according to claim 13, comprising:

a backing layer fixed to said oscillators through said metal layers and having an acoustic impedance Zb lying in a range of $1.0 \times 10^6$ kg/m²s $\leq$ Zb $\leq 5.0 \times 10^6$ kg/m²s.

21. An ultrasonic diagnostic apparatus according to claim 13, wherein said piezoelectric crystal material is a perovskite type solid solution expressed by Pb $((M1_{1/3}Nb_{(2/3)-(2z/3)}Ta_{2z/3})_{1-x-y}Ti_xM2_y)O_3$, wherein M1 is at least one metal selected from Zn, Ni and Kg, M2 is at least one metal selected from Pt, Fe, Bi, Rh and Ir, and x, y and z are respectively defined as $0.05 \leq x \leq 0.2, 0 \leq y \leq 0.01, 0 \leq z \leq 0.1$.

22. An ultrasonic diagnostic apparatus according to claim 13, wherein said piezoelectric crystal material is a perovskite type solid solution expressed by Pb $((M3_{1/2}Nb(1/2)-(z/2)Ta_{z/2})_{1-x-y}Ti_xM2_y)O_3$, wherein M2 is at least one metal selected from Pt, Fe, Bi, Rh and Ir, M3 is at least one metal selected from Sc and In, and x, y and z are respectively defined as $0.2 \leq x \leq 0.6, 0 \leq y \leq 0.01, 0 \leq z \leq 0.1$.

23. An ultrasonic diagnostic apparatus according to claim 13, wherein said piezoelectric crystal material is a perovskite type solid solution expressed by Pb $((Zn_{1/3}Nb_{(2/3)})_{1-x}Ti_x)O_3$, wherein x is defined as $0.05 \leq x \leq 0.2$.

24. An ultrasonic diagnostic apparatus according to claim 13, wherein said piezoelectric crystal material comprises a single crystal.

\* \* \* \* \*

UNITED STATES PATENT AND TRADEMARK OFFICE
CERTIFICATE OF CORRECTION

PATENT NO.    : 6,153,967
DATED         : November 28, 2000
INVENTOR(S)   : Tsuyoshi Kobayashi, et al.

It is certified that error appears in the above-identified patent and that said Letters Patent is hereby corrected as shown below:

<u>Title page,</u>
Item [30], the Foreign Application Data has been omitted. Item [30] should read as follows:

-- [30] Foreign Application Priority Data

| Sep. 24, 1997 | [JP] | Japan | 9-258095 |
| July 22, 1998 | [JP] | Japan | 10-206509 -- |

Signed and Sealed this

Twenty-third Day of October, 2001

Attest:

NICHOLAS P. GODICI
Attesting Officer     Acting Director of the United States Patent and Trademark Office